(12) United States Patent
Rettig et al.

(10) Patent No.: US 6,634,232 B1
(45) Date of Patent: Oct. 21, 2003

(54) ACCELERATION SENSOR WITH LIMITED MOVABILITY IN THE VERTICAL DIRECTION

(75) Inventors: Rasmus Rettig, Gerlingen (DE); Oliver Kohn, Reutlingen (DE); Frank Fischer, Gomaringen (DE); Dietrich Schubert, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/110,618

(22) PCT Filed: Aug. 25, 2000

(86) PCT No.: PCT/DE00/02913

§ 371 (c)(1),
(2), (4) Date: Sep. 19, 2002

(87) PCT Pub. No.: WO01/29565

PCT Pub. Date: Apr. 26, 2001

(30) Foreign Application Priority Data

Oct. 15, 1999 (DE) .......................................... 199 49 605

(51) Int. Cl.[7] .............................................. G01P 15/00
(52) U.S. Cl. ................... 73/514.15; 73/514.32
(58) Field of Search .................... 73/514.15, 514.29, 73/514.32

(56) References Cited

U.S. PATENT DOCUMENTS 5,121,633 A 6/1992 Murakami et al.
6,214,243 B1 * 4/2001 Muenzel et al. ................ 216/2

FOREIGN PATENT DOCUMENTS

| DE | 39 20 645 | 1/1991 |
| DE | 198 30 476 | 2/1999 |
| EP | 0 766 089 | 4/1997 |
| WO | WO 99/12002 | 3/1999 |

* cited by examiner

Primary Examiner—Richard A. Moller
(74) Attorney, Agent, or Firm—Kenyon & Kenyon

(57) ABSTRACT

The present invention relates to an acceleration sensor including an oscillating structure which is movably suspended on a substrate and deflectable in response to the action of an acceleration, a plane of oscillation of the oscillating structure being essentially parallel to a substrate plane, and further including evaluation arrangements for measuring a deflection of the oscillating structure due to acceleration. In this context, provision is made for stop arrangements which limit a deflection movement of the oscillating structure in a direction essentially perpendicular to the plane of oscillation (x-, y-plane) of the oscillating structure.

7 Claims, 6 Drawing Sheets

ACCELERATION SENSOR WITH LIMITED MOVABILITY IN THE VERTICAL DIRECTION

FIELD OF THE INVENTION

The present invention relates to an acceleration sensor.

BACKGROUND INFORMATION

Acceleration sensors of the type having an oscillating structure which is movably suspended on a substrate as a seismic mass are known. This seismic mass is deflected in response to the action of an acceleration and changes its position relative to the substrate. The seismic mass is assigned evaluation arrangements which measure the degree of deflection due to acceleration. Conventional evaluation arrangements are, for example, piezoresistive, capacitive, or frequency analog evaluation systems. In the case of the capacitive evaluation arrangements, the seismic mass is provided with a comb structure which co-operates with a stationary comb structure, i.e., one that is connected to the substrate. Between the individual webs of the comb structures, capacitances come about whose magnitudes vary as the seismic mass is deflected.

These changes in capacitance may be measured via evaluation circuits, thus permitting detection of an acceleration acting upon the acceleration sensor.

As is generally conventional, one plane of oscillation of the oscillating structure within which the deflection due to acceleration takes place lies in a substrate plane. It is conventional to assign laterally acting stops to the oscillating structure, the intention for the stops being to prevent the comb structure which is connected to the oscillating structure from striking the stationary comb structure which is connected to the substrate. In this manner, mechanical destructions of the comb structures are prevented.

The conventional acceleration sensors have the disadvantage that an acceleration which acts in a direction essentially perpendicular to the plane of oscillation may cause the oscillating structure to deflect out of the plane of oscillation. In response to the action of a correspondingly high acceleration acting in a direction essentially perpendicular to the plane of oscillation, it is possible for the oscillating structure to jump out of the existing lateral guide structures so that the functioning of the acceleration sensor is impaired or made impossible. Since acceleration sensor of that kind are used, for example, in safety-relevant equipment of motor vehicles, for instance, for tripping air bags, belt pretensioners, or the like, a failure involves a considerable safety hazard.

SUMMARY

The acceleration sensor according to the present invention may offer the advantage that the performance reliability of the acceleration sensor may not be impaired by accelerative forces acting in a direction essentially perpendicular to the plane of oscillation. By providing stop arrangements which limit a deflection movement of the oscillating structure in a direction essentially perpendicular to the plane of oscillation of the oscillating structure, it may be achieved in an advantageous manner that the oscillating structure may not jump out of its lateral guide structures in response to the action of generally non-detectable accelerative forces which may be in a direction essentially perpendicular to the plane of oscillation. Besides the conventional lateral guide structures, the stop arrangements thus constitute additional guide structures which act perpendicularly (vertically) to the plane of oscillation.

In an example embodiment of the present invention, provision may be made for the vertically acting stop arrangements to be arranged underneath the oscillating structure. In this manner, it may be achieved that these stop arrangements are integrated in the acceleration sensor so that no additional device height may be needed. The stop arrangements may be connected to the oscillating structure with a force-locking fit; a counterstop being formed by an element which may be connected, with a force-locking fit, to the substrate. In this manner, it may be possible for the stop arrangements to be integrated in the sensor element in a simple manner. Moreover, the element constituting the counterstop may be an evaluation electrode of the evaluation arrangements, the evaluation electrode being connected to the substrate. In may be advantageously possible to maintain a conventional and proven efficient, acceleration sensor layout so that the outlay for manufacturing the acceleration sensors including the additional, vertically acting stop arrangements is essentially not increased.

In the following, the present invention will be explained in greater detail in the light of example embodiments with reference to the appertaining drawings.

DETAILED DESCRIPTION

Figure 1:
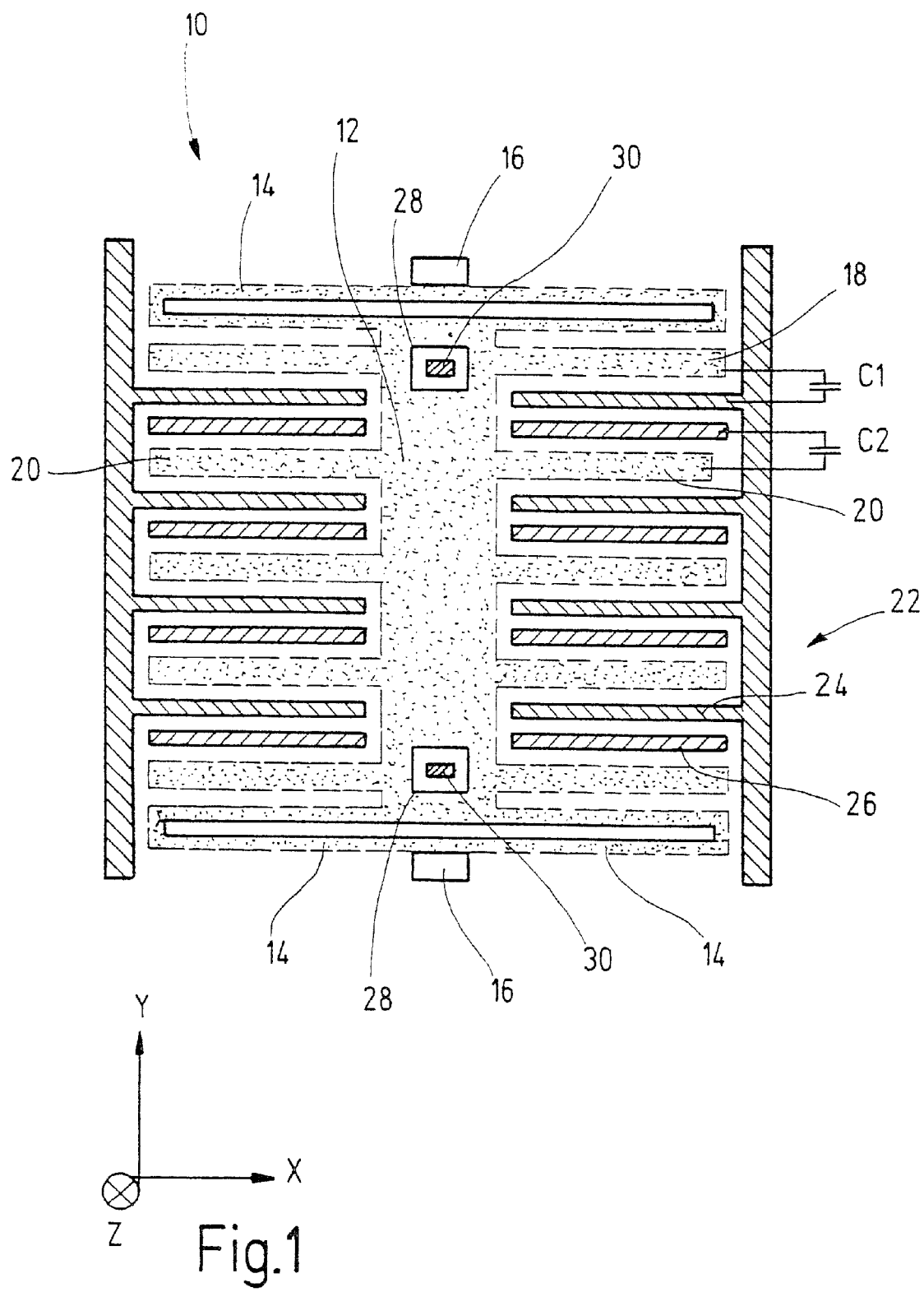
FIG. 1 is a schematic top view of a first example embodiment of an acceleration sensor.

FIG. 1 is a top view of the design of an acceleration sensor 10. Acceleration sensor 10 is patterned on a substrate, such as a wafer. The patterning may be carried out using conventional surface micromachining methods. In the representation illustrated, the wafer is constituted by the plane of paper. The wafer may at the same time have electric evaluation circuits for acceleration sensor 10.

Acceleration sensor 10 features an oscillating structure 12 which is formed as a seismic mass. Oscillating structure 12 is suspended in a manner that it is movable relative to the substrate (wafer). To this end, oscillating structure 12 is coupled to spring elements 14 which may be connected to the substrate via fixing points 16. These fixing points 16 support the entire arrangement of the oscillating structure 12 and spring elements 14 which may be otherwise suspended freely above the substrate. This may be carried out using conventional process steps for manufacturing surface micromachined structures, the freely suspended regions being undercut, resulting in a small gap between the substrate and oscillation structure 12 or spring elements 14.

Oscillating structure 12 may have a comb structure 18 on both sides, the comb structure being constituted by fingers 20 which may be formed perpendicular to the surface of the substrate. Comb structures 18 have a rigid design so that they oscillate together with oscillating structure 12 while oscillating structure 12 is in motion.

Moreover, acceleration sensor 10 features evaluation arrangement 22 which may be constituted by stationary comb structures. These include electrodes 24 and electrodes 26 which spring from the substrate (wafer) and may be disposed between fingers 20 of oscillating structure 12. Electrodes 24 and fingers 20 form capacitances C1 in between, and capacitances C2 may be formed between electrodes 26 and fingers 20. For this purpose, electrodes 24 and 26 as well as oscillating structure 12 may be connected via fixing points 16 to an evaluation circuit. Capacitances C1 and C2 may be determined by a spacing of fingers 20 from electrodes 24 and 26, respectively. Since the whole material of acceleration sensor 10 may be composed of an electrically conductive material as, for example, silicon, it may be possible for capacitances C1 and C2 to be integrated in the substrate and thus, in an evaluation circuit.

Oscillating structure 12 may have openings 28 with which engages in each case a lateral stop 30 which is connected to the substrate (wafer).

The acceleration sensor 10 may have the following, generally conventional function. For the purpose of illustration, x-, y- and z-axes are plotted in a coordinate system. In this context, the x- and y-axes define the plane of oscillation of oscillating structure 12 which coincides with the plane of paper, according to the representation in FIG. 1. The z-axis runs in a direction perpendicular to the plane of oscillation. During normal use, acceleration sensors 10 may be placed in a manner permitting detection of the action of an acceleration which acts in y-direction. When such an acceleration acts upon acceleration sensor 10, oscillating structure 12 may be deflected in y-direction. Because of this, the clearances between fingers 20 on the one side and electrodes 24 or 26 on the other side may be changed. Via the involved change in capacitances C1 and C2, it may be possible to determine a voltage quantity which is proportional to the acting acceleration and which is available for further evaluation.

The inventive modification of acceleration sensor 10 which is depicted in FIG. 1 and conventional will be described with reference to the following Figures. According to the present invention, provision may be made for vertical stop arrangements to be integrated in addition to lateral stops 30.

These vertical stops prevent oscillating structure 12 from being deflected in the direction of the z-axis by more than a predeterminable amount.

FIGS. 2 through 6 each illustrate a sectional view through acceleration sensor 10 during individual process steps for manufacturing acceleration sensor 10. FIGS. 2 through 6 depict acceleration sensor 10 only in cutaway portions in the region of later openings 28 of oscillating structures 12. The x-, y-, and z-axes are drawn in again for the purpose of orientation. The individual process steps for patterning acceleration sensor 10 are conventional.

Figure 2:
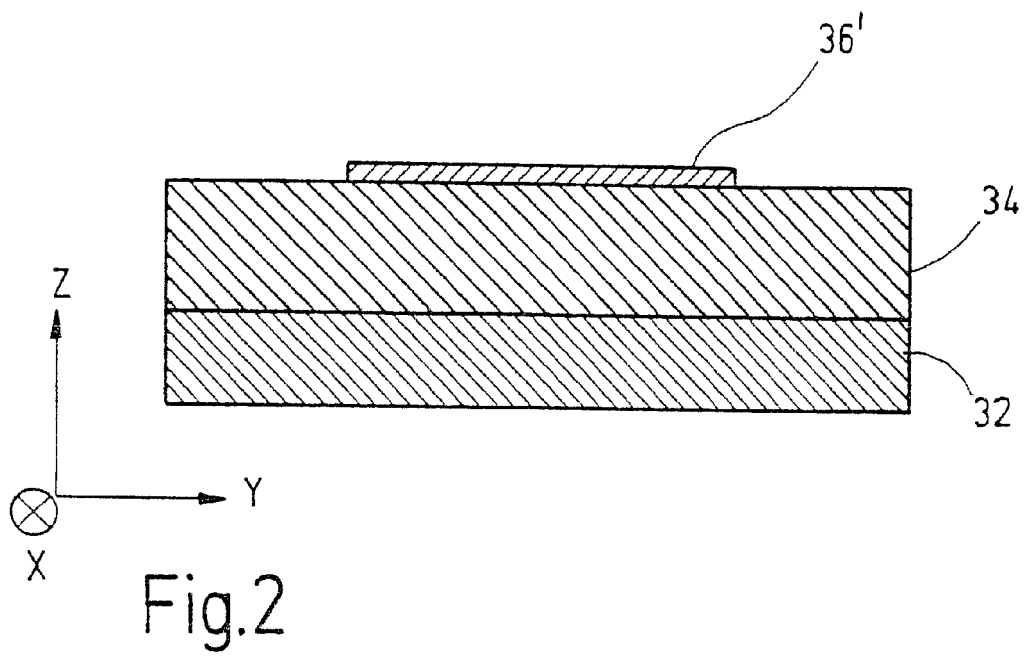
FIGS. 2 through 6 schematically illustrate individual process steps for achieving an acceleration sensor which features vertical stop arrangement.

Initially, an insulating layer 34 may be produced on a starting wafer 32, as illustrated in FIG. 2. This insulating layer 34 may be, for example, a thermal silicon oxide $SiO_2$ or a borophosphosilicate glass. The layer thickness of insulating layer 34 may be, for example, between 0.5 $\mu$m and 3 $\mu$m. An interconnect layer 36' may be deposited on insulating layer 34, for example, using a CVD (chemical vapor deposition) method. Interconnect layer 36' may have a layer thickness of, for example, between 0.3 $\mu$m and 2 $\mu$m.

Figure 3:
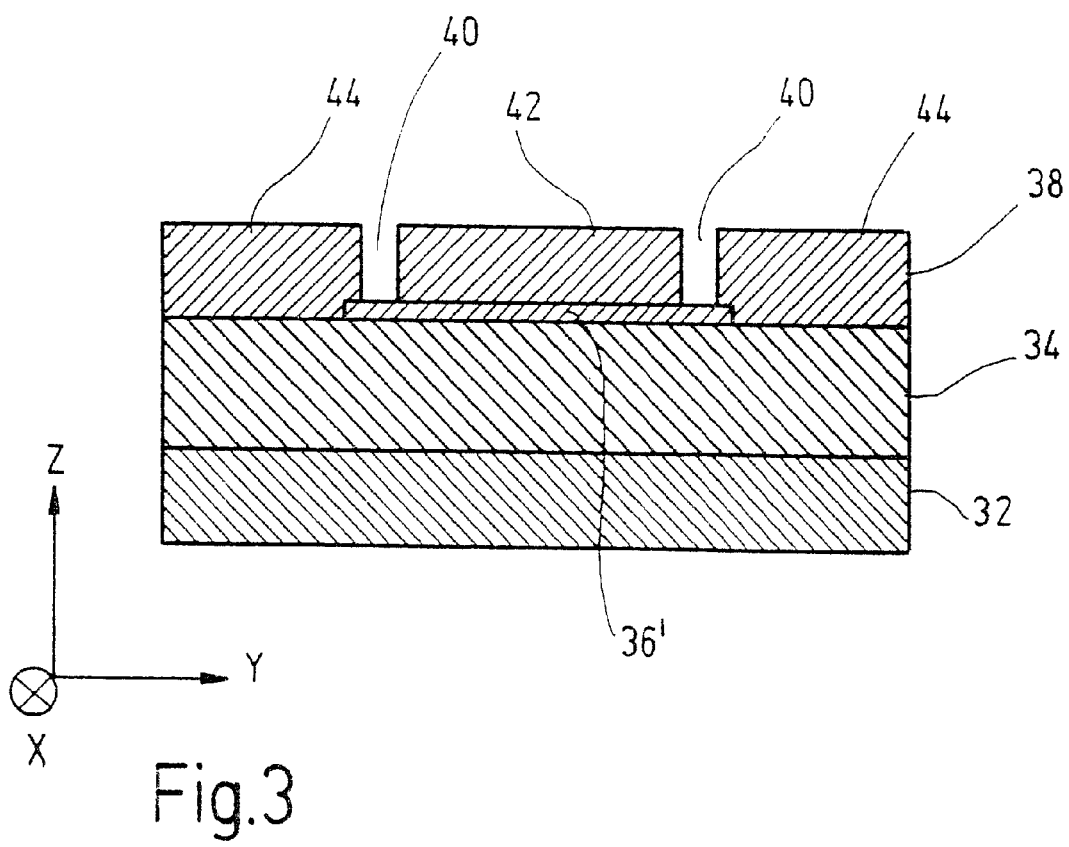

Subsequently, a sacrificial layer 38 may be applied, as illustrated in FIG. 3. Sacrificial layer 38 may be composed, for example, of silicon oxide $SiO_2$ or borophosphosilicate glass. Initially, trench-like openings 40 may be made in this sacrificial layer 38, resulting in a central region 42 and outer regions 44. Trench-like openings 40 extend down to interconnect layer 36'.

Figure 4:
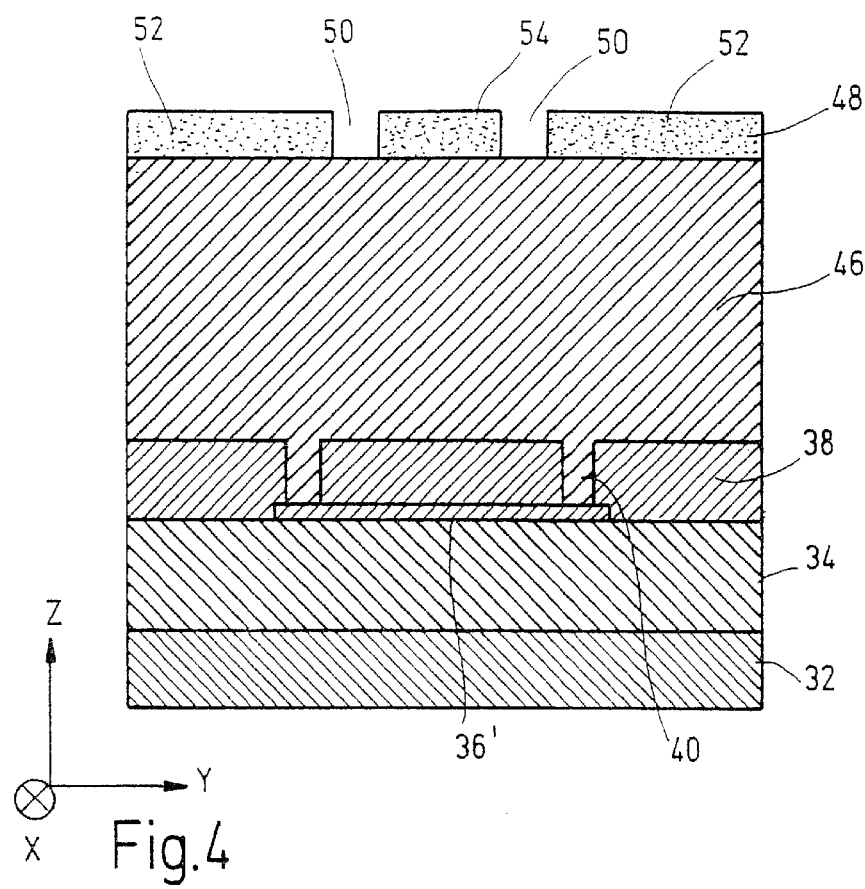

Subsequently, a further functional layer 46 may be deposited, as illustrated in FIG. 4, the functional layer having a thickness, for example, between 2 $\mu$m and 20 $\mu$m. Due to the preceding patterning of trench-like openings 40, functional layer 46 may also be deposited into trench-like openings 40, resulting in a contacting to interconnect layer 36'. A further masking layer 48 may be deposited on functional layer 46. According to the later design of acceleration sensor 10, trench-like depressions 50 may be made in this masking layer 48, defining regions 52 and regions 54 of masking layer 48. Regions 52 cover functional layer 46 in the region of later structures of acceleration sensor 10 which will be movably arranged whereas regions 54 cover sections of functional layer 46 which define later stationary regions of acceleration sensor 10 which will be connected to the substrate.

Figure 5:
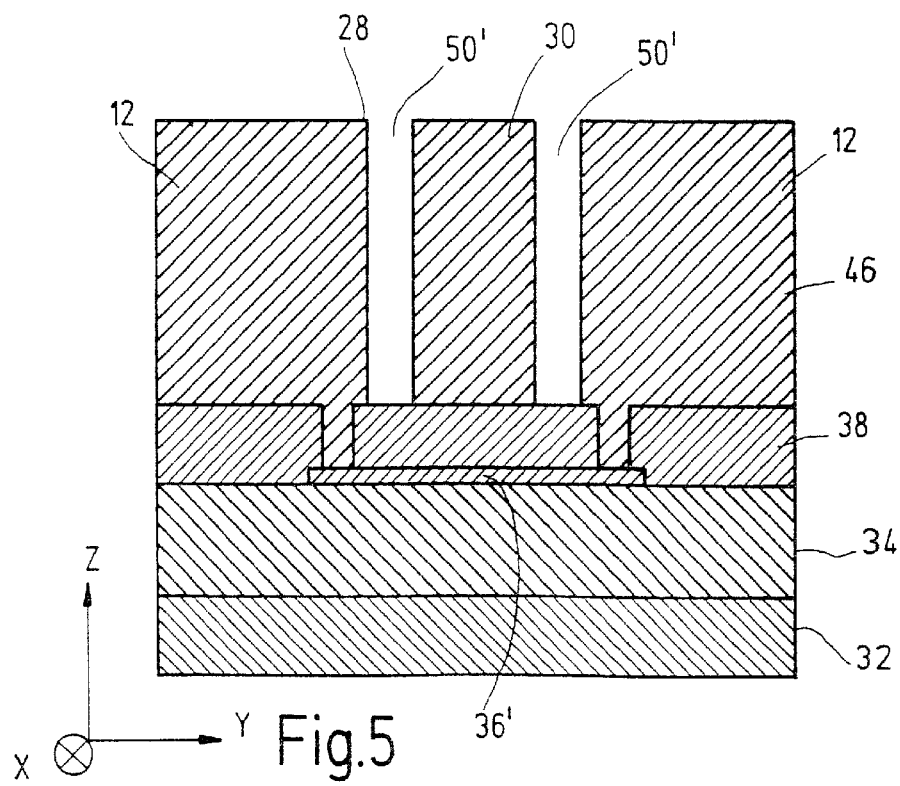

In the following, a selective anisotropic etching of functional layer 46 may be carried out via trench-like openings 50, as illustrated in FIG. 5. Masking layer 48 may be removed in a subsequent process step. The selective anisotropic etching of trenches 50' stops automatically at sacrificial layer 38. Later opening 28 of acceleration sensor 10, which may be located within oscillating mass 12 and with which the later lateral stop 30 will engage, is defined through the etching of trenches 50'.

Figure 6:
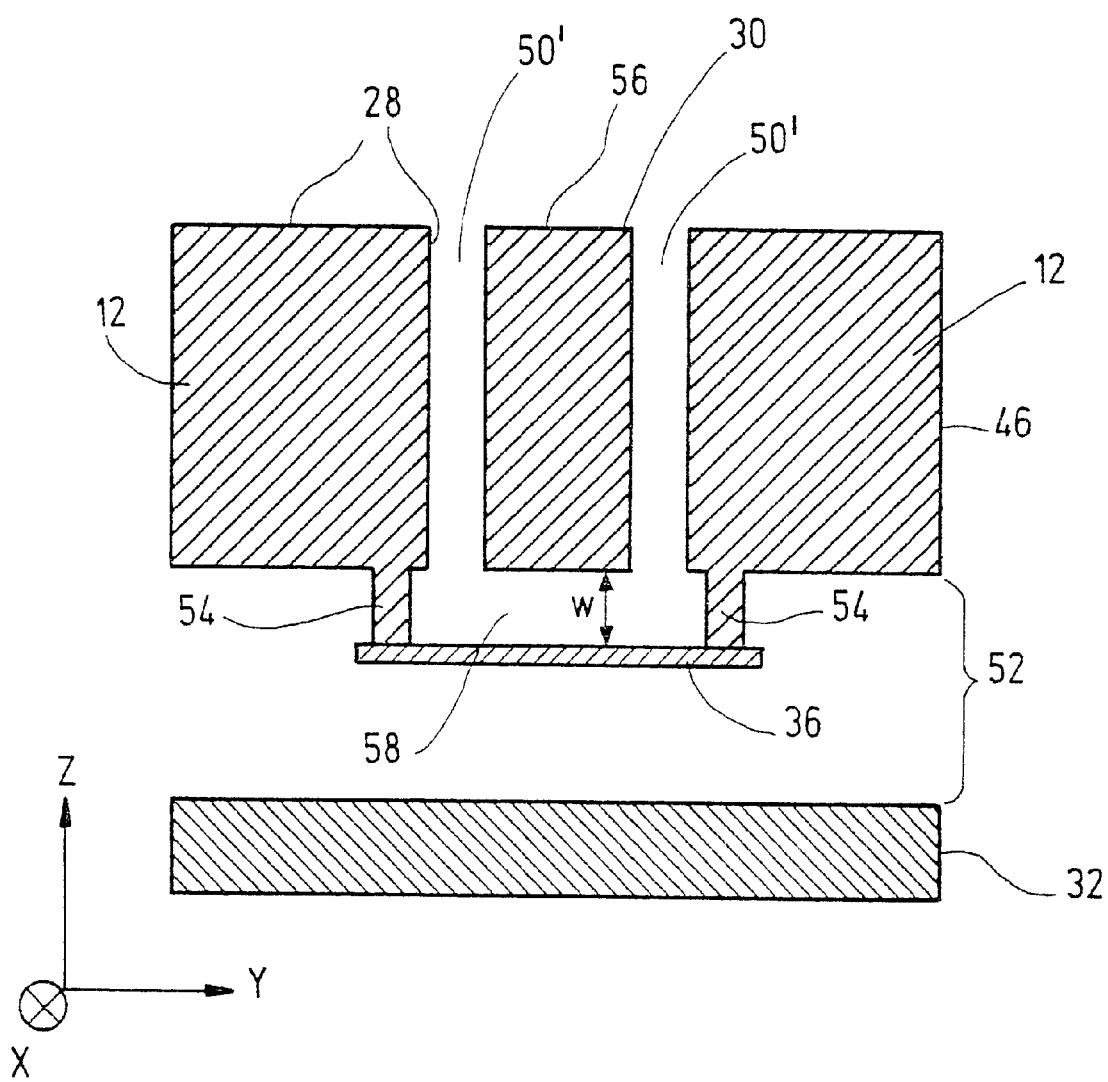

FIG. 6 illustrates that sacrificial layer 38 and insulating layer 34 may be selectively removed (etched) in a following operation, resulting in a gap 52 between oscillating structure 12 and starting wafer 32, as a result of which oscillating structure 12.is movably suspended (via spring elements 14 according to FIG. 1) above starting wafer 32 (substrate). Due to the selective etching of sacrificial layer 38 and insulating layer 34, interconnect layer 36' remains connected, with a force-locking fit, to oscillating structure 12 via connecting elements 54. Connecting elements 54 correspond to the filling of functional layer 46 into trench-like openings 40 (FIG. 4). At the same time, section 56 of lateral stop 30, as illustrated in the sectional views in FIGS. 2 through 6, is undercut, resulting in a gap 58 having a gap width w between interconnect layer 36' and section 56. Gap width w follows from the thickness of sacrificial layer 38. Now, interconnect layer 36' constitutes a stop arrangement which will be denoted by 36 hereinafter.

By laying bare oscillating structure 12, stop arrangement 36 may be disposed underneath the equally laid bare section 56 of lateral stop 30. As a result of this, therefore, lateral stop 30 limits, on one hand, a deflection of oscillating structure 12 in x- or y-direction in accordance with the arrangement of opening 28. Furthermore, via section 56 of lateral stop 30, the deflection of oscillating structure 12 may be limited in z-direction at the same time. The maximum deflection of oscillating structure 12 in z-direction follows from gap width w of gap 58. In this manner, oscillating structure 12 may be prevented from jumping out of its plane of oscillation (sensing plane) in response to the occurrence of an accelerative force in z-direction as a result of which the functioning of acceleration sensor 10 would be impaired or no longer be given.

Figure 7:
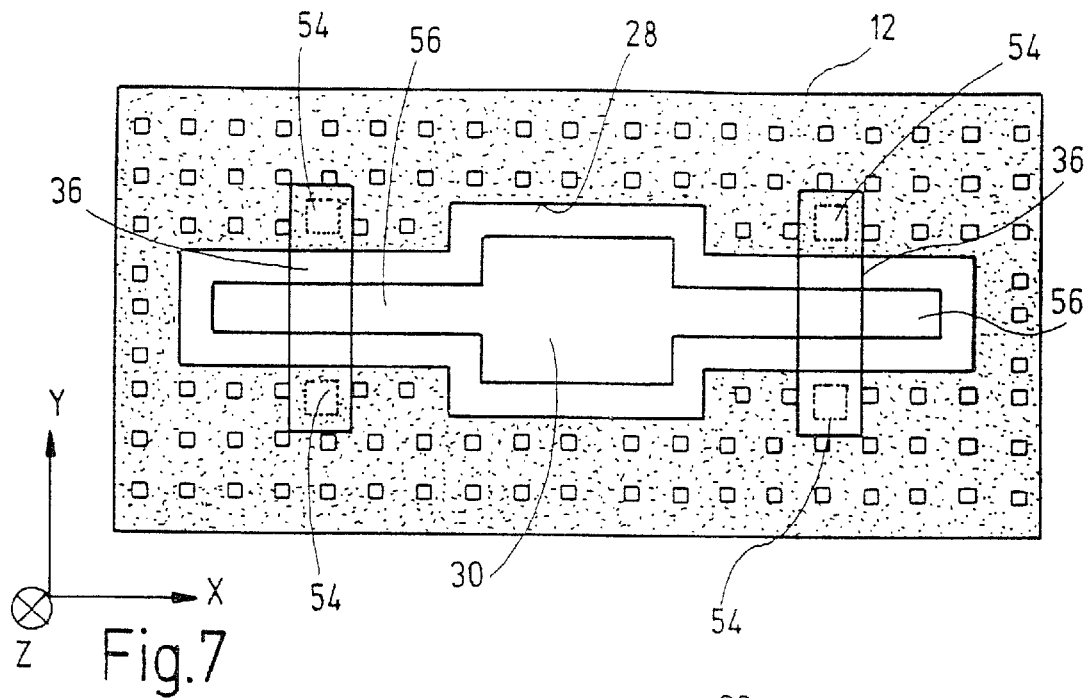
FIG. 7 illustrates a schematic top view of the acceleration sensor with integrated vertical stop arrangement.

In FIG. 7, the region of oscillating structure 12 in which lateral stop 30 and stop arrangement (vertical stop) 36 may be formed is illustrated in a detail enlargement.

It becomes clear that additional stop arrangement 36 and counterstop 56 for limiting a vertical deflection of oscillating structure 12 may be produced by small changes in the design of acceleration sensor 10.

The detail enlargement illustrated in FIG. 7 of oscillation structure 12 in the region of opening 28 refers to at least one of openings 28 but may also be formed at both openings 28 of oscillating structure 12 (FIG. 1).

Figure 8:
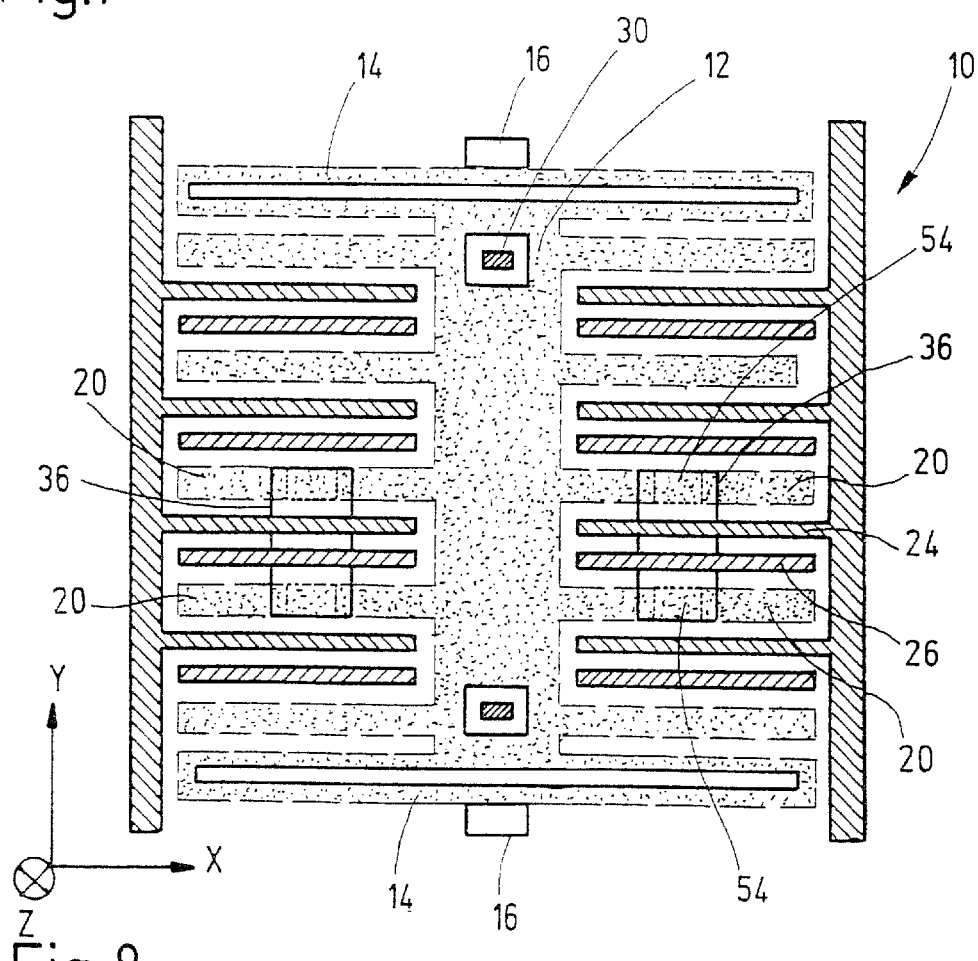
FIG. 8 illustrates a schematic detail enlargement of the arrangement of vertical stop arrangement in another example embodiment.

In FIG. 8, an acceleration sensor 10 is illustrated once more in a top view, illustrating another possible design of the vertical stop. While in the preceding example embodiments, interconnect layer 36' may be fastened directly to oscillating structure 12 via connecting elements 54, provision may also be made for interconnect layer 36' to be patterned underneath two neighboring fingers 20 of oscillating structure 12. In this case, subsequent to etching sacrificial layer 38 away, interconnect layer 36' reaches under electrodes 24 and 26 in regions thereof, the electrodes being connected, with a force-locking fit, to starting wafer 32 (substrate). Thus, the counterstop for interconnect layer 36' may be constituted here by electrodes 24 and 26, respectively. In this context, interconnect layer 36' and, thereby, stop arrangement 36 may be arranged at opposite fingers 20 of oscillating structure 12.

Figure 9:
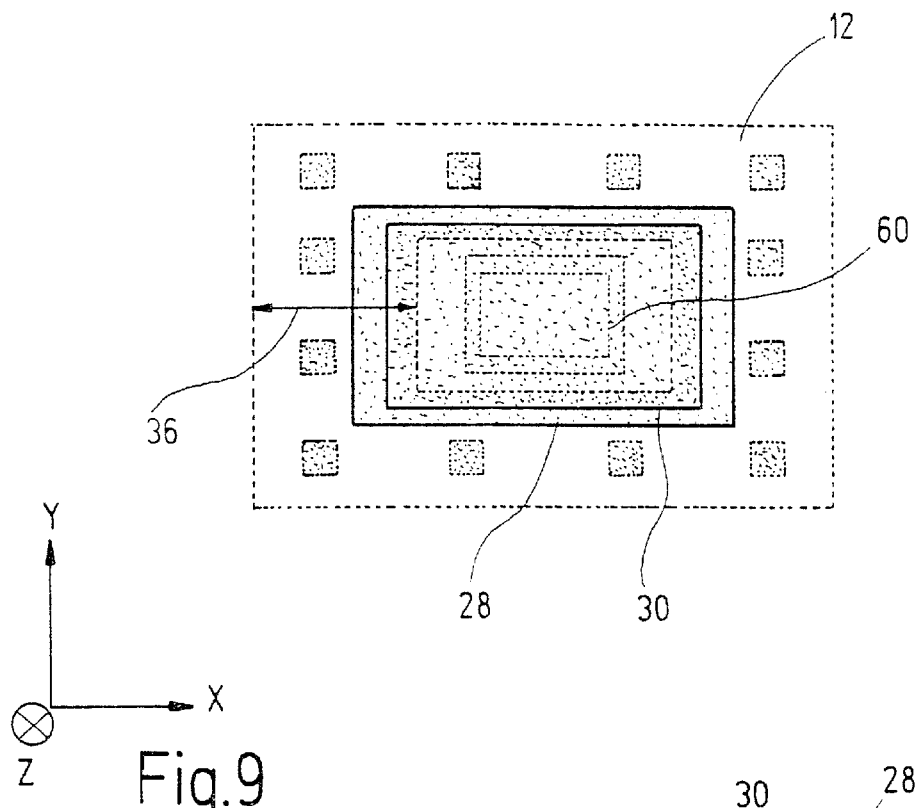
FIGS. 9 and 10 depict the arrangement of vertical stop arrangement on an acceleration sensor in an example embodiment.
Figure 10:
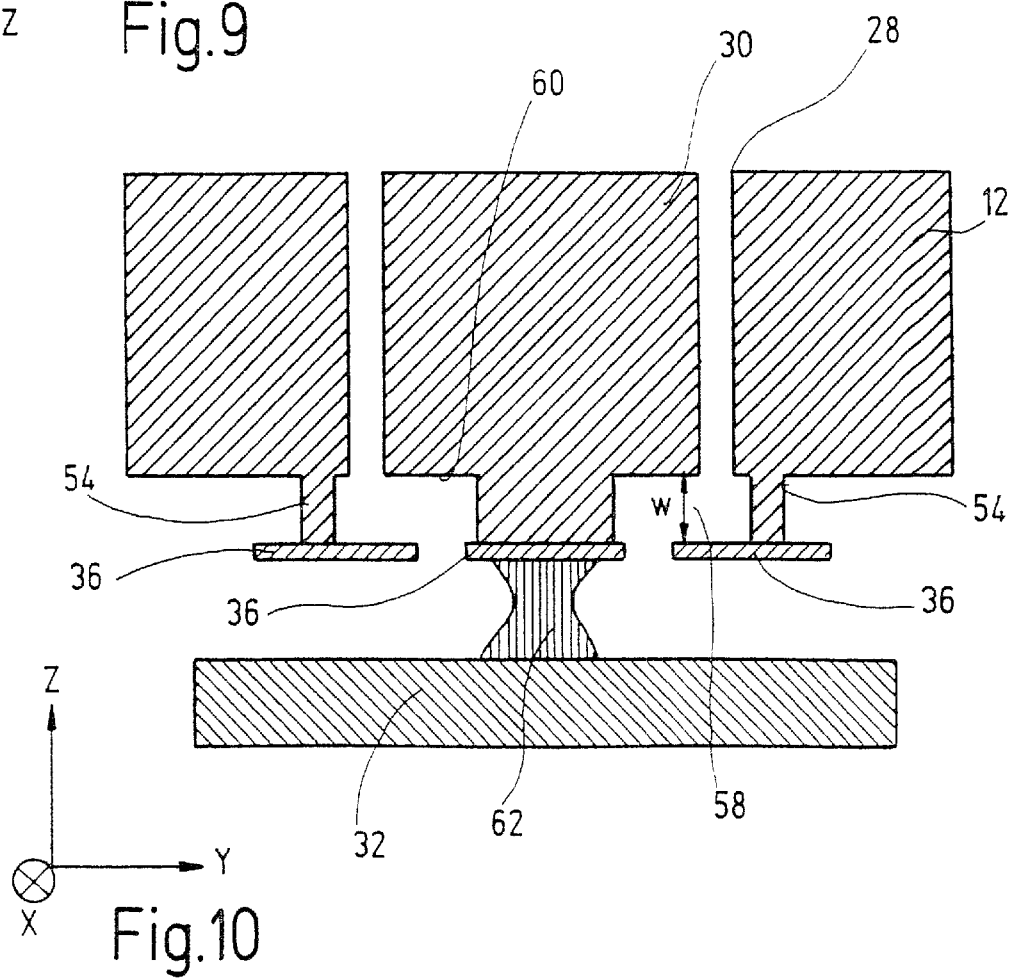

FIGS. 9 and 10 illustrate another example embodiment for forming the stop arrangement acting in z-direction in the region of lateral stops 30. Parts which are identical to those in the preceding Figures are provided with the same reference numbers for better understanding, regardless of slight differences in design.

FIG. 9 is a schematic top view of oscillating structure 12 in the region of an opening 28. Lateral stop 30 engages with opening 28. This lateral stop 30 may have a ring step 60 running in the direction of starting wafer (substrate) 32, as is illustrated more clearly by the section view in FIG. 10. Now, interconnect layer 36' may be applied on insulating layer 34 (FIG. 2) in such a manner that it runs annularly around lateral stop 30, interconnect layer 36' partially cantilevering into the region of ring step 60. Lateral stop 30 may be connected, with a force-locking fit, to starting wafer 32 via an oxide bridge 62.

An example embodiment of that kind also makes it possible, on one hand, to limit the movement of oscillating structure 12 in x- and y-directions through the engagement of lateral stop 30 with opening 28. Because interconnect layer 36' annularly encircles lateral stop 30 and partially cantilevers into ring step 60, gap 58 may be formed there with a gap width w with respect to lateral stop 30. In this manner, oscillating structure 12 may be limited in its ability to move in z-direction.

What is claimed is:

1. An acceleration sensor, comprising:

a moveable, oscillating structure suspended on a substrate and which is deflectable in response to acceleration, a plane structure of oscillation of the oscillating structure being essentially parallel to a substrate plane;

an evaluation arrangement for measuring a deflection of the oscillating structure due to acceleration;

a stop arrangement for limiting a deflection movement of the oscillating structure, wherein the stop arrangement is essentially perpendicular to the plane of oscillation of the oscillating structure, and wherein the stop arrangement is situated between the oscillating structure and the substrate, and wherein the stop arrangement is connected to the oscillating structure in a force-locked manner; and an element connected to the substrate in a force-locked manner forming a counter-stop.

2. The acceleration sensor according to claim 1, wherein the stop arrangement is connected to the oscillating structure via a connecting element.

3. The acceleration sensor according to claim 2, wherein a gap width of a gap between the stop arrangement of the oscillating structure and the counter-stop is determined by a length of the connecting element.

4. The acceleration according to claim 3, wherein the counter-stop includes a section of a lateral stop.

5. The acceleration sensor according to claim 4, wherein the lateral stop forms a ring step facing in the direction of the substrate to form the counter-stop.

6. The acceleration sensor according to claim 5, wherein the stop arrangement is arranged underneath at least two neighboring fingers of the oscillating structure.

7. The acceleration sensor according to claim 6, wherein the counter-stop includes at least one electrode of an evaluation circuit of the acceleration sensor, the at least one electrode extending between the fingers.

\* \* \* \* \*